United States Patent
Lehmann

(10) Patent No.: US 8,389,955 B2
(45) Date of Patent: Mar. 5, 2013

(54) METHOD FOR THINNING A SAMPLE AND SAMPLE CARRIER FOR PERFORMING SAID METHOD

(75) Inventor: Ralf Lehmann, Großerkmannsdorf (DE)

(73) Assignee: FEI Company, Hillsboro, OR (US)

( * ) Notice: Subject to any disclaimer, the term of this patent is extended or adjusted under 35 U.S.C. 154(b) by 1045 days.

(21) Appl. No.: 12/026,521

(22) Filed: Feb. 5, 2008

(65) Prior Publication Data

US 2008/0185286 A1 Aug. 7, 2008

(30) Foreign Application Priority Data

Feb. 5, 2007 (ER) .................................. 07101731

(51) Int. Cl.
  *G01F 23/00* (2006.01)
  *G21K 5/08* (2006.01)
  *G21K 5/10* (2006.01)

(52) U.S. Cl. .............................. 250/440.11; 250/442.11

(58) Field of Classification Search ............. 250/440.11, 250/442.11, 306, 307, 310, 311
See application file for complete search history.

(56) References Cited

U.S. PATENT DOCUMENTS

| | | | | |
|---|---|---|---|---|
| 6,140,652 | A * | 10/2000 | Shlepr et al. | 250/440.11 |
| 6,300,631 | B1 * | 10/2001 | Shofner | 250/311 |
| 7,005,636 | B2 | 2/2006 | Tappel | |
| 7,034,316 | B2 | 4/2006 | Wagner et al. | |
| 7,345,289 | B2 * | 3/2008 | Iwasaki et al. | 250/440.11 |
| 7,375,325 | B2 | 5/2008 | Burkhardt et al. | |
| 7,482,587 | B1 * | 1/2009 | Finch | 250/440.11 |
| 7,511,282 | B2 | 3/2009 | Agorio et al. | |
| 7,554,099 | B2 * | 6/2009 | Chao et al. | 250/440.11 |

(Continued)

FOREIGN PATENT DOCUMENTS

| | | |
|---|---|---|
| JP | 2006244742 | 9/2006 |
| WO | 2005123227 | 12/2005 |

(Continued)

OTHER PUBLICATIONS

Moore, T.M., The total release method for FIB in-situ TEM sample preparation, Microscopy Today, Jul. 2005, vol. 13, No. 4, pp. 40 & 42.

(Continued)

*Primary Examiner* — Phillip A Johnston
*Assistant Examiner* — Brooke Purinton
(74) *Attorney, Agent, or Firm* — Scheinberg & Associates, PC; Michael O. Scheinberg

(57) ABSTRACT

A sample carrier (3) for thinning a sample (1) taken from e.g. a semiconductor wafer. The sample carrier comprises a rigid part (5), e.g. made of e.g. copper, with an outer boundary (6), and a supporting film (4), e.g. made of carbon, extending beyond the outer boundary. By placing the sample on the supporting film, the sample can be attached to the rigid structure using e.g. IBID. The supporting film aligns the samples when they are placed onto it. After attaching the sample to the rigid structure the sample can be thinned with e.g. an ion beam, during which thinning the supporting film is locally removed as well. The invention results in better alignment of the sample to the sample carrier, and also in more freedom how the sample is transported from the wafer to the sample carrier, e.g. with the help of an electrically charged glass needle (2). The latter eliminates the attaching/severing steps that are normally associated with the transport of a sample to a sample carrier.

16 Claims, 2 Drawing Sheets

U.S. PATENT DOCUMENTS

| | | |
|---|---|---|
| 7,615,745 B2 | 11/2009 | Schampers et al. |
| 7,820,982 B2 * | 10/2010 | Moon et al. ............... 250/440.11 |
| 2004/0056194 A1 * | 3/2004 | Moore et al. .................. 250/307 |
| 2005/0011456 A1 | 1/2005 | Himori et al. |
| 2007/0210253 A1 * | 9/2007 | Behar et al. ............... 250/440.11 |
| 2008/0173813 A1 | 7/2008 | van de Water et al. |
| 2008/0250881 A1 | 10/2008 | Dona |

FOREIGN PATENT DOCUMENTS

| | | |
|---|---|---|
| WO | 2008051880 | 5/2008 |

OTHER PUBLICATIONS

Huang, Z., "Combining Ar Ion Milling with FIB Lift-out Techniques to Prepare High Quality Site-Specific TEM Samples," Journal of Microscopy, Sep. 2004, pp. 219-223, vol. 215, Part 3.

Langford, R.M., "Preparation of Transmission Electron Microscopy Cross-Section Specimens Using Focused Ion Beam Milling," J. Vac. Sci. Technol., Sep./Oct. 2001, pp. 2186-2193, vol. A 19(5).

* cited by examiner

METHOD FOR THINNING A SAMPLE AND SAMPLE CARRIER FOR PERFORMING SAID METHOD

BACKGROUND AND SUMMARY OF THE INVENTION

The invention relates to a method for thinning a sample, the method comprising:
  providing a sample attached to a probe,
  providing a sample carrier, said sample carrier showing a rigid structure, said rigid structure showing an boundary to which the sample can be attached,
  attaching the sample to the boundary of the rigid structure, and
  exposing the sample to a milling process or an etching process so as to at least partially thin the sample.

The invention further relates to a sample carrier equipped to perform the method according to the invention.

Such a method is known from "The total release method for FIB in-situ TEM sample preparation", T. M. Moore, Microscopy Today, Vol. 13, No. 4, pages 40-42, more specifically page 40, column 2 as "The total release method for in-situ lift-out".

Such a method is used in e.g. the semiconductor industry, where samples are taken from semiconductors for inspection/analysis in e.g. a Transmission Electron Microscope (TEM) by irradiating the wafers with a particle beam, such as a beam of gallium ions. The impinging beam causes removal of material, also known as milling or sputtering of the material.

As known to the person skilled in the art, a semiconductor sample to be inspected in a TEM must be extremely thin, preferably 50 nm or less. As the sample taken out of a semiconductor wafer is often much thicker, the sample needs to be prepared by thinning it after its extraction from the wafer. To obtain a sample with the correct orientation (e.g. along certain crystal orientations of the wafer of which the sample was a part), the sample orientation must be controlled to within e.g. 1 degree during the milling process. Incorrect alignment may result in warping of the sample during milling, but may e.g. also result in problems during the subsequent inspection/analysis.

In the known method a sample is cut from the semiconductor wafer. The sample may be cut in e.g. a Focused Ion Beam apparatus (FIB) in two ion milling steps, thereby freeing a wedge from the wafer. After separation the sample is then welded to a probe using e.g. Ion Beam Induced Deposition (IBID) and transported to a TEM sample carrier (the so-named lift-out grid). The sample is then welded to the sample carrier (using e.g. IBID) and the probe is detached from the sample by cutting the probe tip. The sample is then exposed to a milling process in the form of FIB milling to thin it to the required thickness.

A disadvantage of the known method is that welding the probe to the sample and severing the sample from the probe takes time. This reduces throughput, which obviously is very important in the industrial environment of the semiconductor industry.

It is remarked that a method is known in which the sample is picked-up with an electrically charged glass needle without making a weld, after which the sample is laid on a conductive membrane (the so-named ex-situ method described in the same article "The total release method for FIB in-situ TEM sample preparation", T. M. Moore, Microscopy Today, Vol. 13, No. 4, pages 40-42, more specifically page 40, column 2). However, it is then not possible to thin the sample after extraction of the sample from the wafer.

Ex-situ lift-out also makes it more difficult to do so-named end-pointing. End-pointing is the process performed to determine when the thinning must be stopped and is preferably done by observing e.g. the electron transparency of the sample during the thinning process (either continuously or by temporary interrupting the thinning process). End-pointing then requires free access to the sample from both sides: one side to direct an electron beam to and the other side to detect transmitted electrons from. Using the ex-situ method, both sides of the sample are formed between the two surfaces of the wafer, and are thus not freely accessible.

Another disadvantage of the known method is that, after attaching the sample to the sample carrier, the orientation of e.g. the crystallographic axes in the sample with respect to the sample carrier is insufficiently reproducible. As a result human intervention is needed to determine the orientation and align the sample during the milling process. This hinders automation of the thinning process.

The invention aims to provide a method with higher throughput and improved parallelism between sample and sample carrier.

BRIEF SUMMARY OF THE INVENTION

The invention describes a sample carrier for thinning a sample taken from e.g. a semiconductor wafer. In one embodiment, the sample carrier comprises a rigid structure of, for example, copper with an outer boundary and a supporting film, e.g., made of carbon, extending beyond the outer boundary. By placing the sample on the supporting film, the sample can be attached to the rigid structure using Electron Beam Induced Deposition (EBID), Ion Beam Induced Deposition (IBID), Laser Beam Induced Deposition (LBID), or by placing a small droplet of glue or resin between the sample and the rigid structure. The supporting film aligns the samples when they are placed onto it. After attaching the sample to the rigid structure the sample can be thinned with an ion beam, during which thinning the supporting film is locally removed as well. The invention results in better alignment of the sample to the sample carrier, and also in more freedom how the sample is transported from the wafer to the sample carrier, e.g. with the help of an electrically charged glass needle. The latter eliminates the attaching/severing steps that are normally associated with the transport of a sample to a sample carrier.

BRIEF DESCRIPTION OF THE DRAWINGS

The invention will be elucidated on the basis of schematic drawings, where corresponding features are indicated by corresponding reference symbols.

To that end.

DETAILED DESCRIPTION OF PREFERRED EMBODIMENTS

Figure 1A:
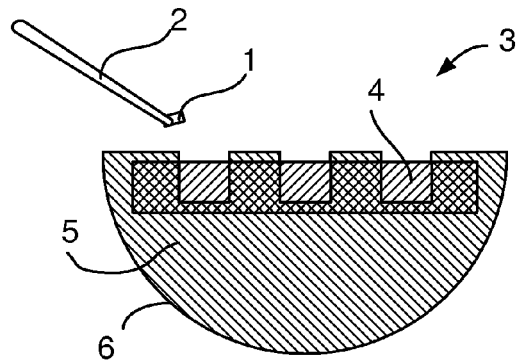
FIG. 1A schematically depicts the sample carrier according to the invention and a probe with the sample approaching the sample carrier, FIG. 1B schematically depicts the sample carrier where the probe positions the sample on the supporting film, FIG. 1C schematically depicts the sample carrier and the sample attached to it, FIG. 1D schematically depicts a cross section of the sample carrier and the sample attached to it, FIG. 1E schematically depicts a detail from FIG. 1D after thinning of the sample, FIG. 1F schematically depicts the sample carrier and the thinned sample attached to it, FIG. 2 schematically depicts an alternative sample carrier according to the invention.

To that end the method according to the invention is characterized in that
- the sample carrier is provided with a supporting film adhered to said rigid structure, said supporting film at least partially extending beyond the boundary to which the sample can be attached, and
- before attaching the sample to the rigid structure the sample is placed on the supporting film.

The sample carrier used in the method according to the invention comprises a rigid structure to which the sample is attached, and a supporting film on which the sample is placed before attaching the sample to the rigid structure of the sample carrier. By placing the sample on the supporting film, the sample can then be attached to the rigid structure with e.g. Electron Beam Induced Deposition (EBID), Ion Beam Induced Deposition (IBID), Laser Beam Induced Deposition (LBID), or e.g. by placing a small droplet of glue or resin between the sample and the rigid structure.

It is remarked that the sample can be placed on either side of the supporting film. The supporting film can be very thin and thereby sufficiently transparent to a beam of light or e.g. electrons to allow good positioning with respect to the rigid structure. Welding the sample to the sample carrier can be done by e.g. glue, in which case the sample is attached to the supporting film, but also to the rigid structure. The latter is possible with e.g. EBID or IBID, as the supporting film is while performing EBID or IBID locally removed, so that a weld to the rigid structure is formed.

The method according to the invention allows the sample to be picked up with e.g. an electrically charged glass needle and deposited on the film, thereby eliminating the time consuming steps of attaching the sample to the probe and severing the sample from the probe.

As the sample is placed on the supporting film, the sample will also align itself with the plane of the supporting film. This enables thinning the sample to a uniform thickness along a well defined plane, and thereby enables further automating the process of sample preparation.

In an embodiment of the method according to the invention the sample is placed on the surface of the film opposite to the rigid structure.

Placing the sample on the side of the supporting film opposite to the rigid structure allows easier positioning of the thin sample. It is remarked that the sample often shows a thickness comparable to or smaller than the thickness of the rigid structure. The side of the supporting film is however a flat surface, allowing said easier positioning.

In a further embodiment of the method according to the invention a part of the supporting film is, after placing the sample on the supporting film, situated between a part of the sample and the rigid structure.

By positioning the sample such that a small part of the film is sandwiched between a part of the sample and the rigid structure, still easier positioning is achieved. A part of the sample is in this embodiment overlapping with the rigid structure, so that a weld can easily be formed between the sample and the rigid structure, while another part of the sample does not show such an overlap, so that imaging that part of the sample in transmission mode is possible. It is remarked that the supporting film does not hinder the thinning of the sample as it is easily removed by the milling process or the etching process that is also used for the thinning of the sample.

In another embodiment of the method according to the invention the boundary is an outer boundary, so that the supporting film is not completely surrounded by the rigid structure.

Milling the sample to the required thickness is e.g. done by irradiating the sample with a beam of particles, in which the beam irradiates the sample at an angle almost parallel to the surface. Therefore sideway access to the sample is required. To make this possible the sample is preferably attached to an outer portion of the rigid structure. This implies that the supporting film at least locally extends outward of the outer boundary of the rigid structure, and is thus not completely surrounded by the rigid structure.

In yet another embodiment of the method according to the invention milling the sample comprises exposing the sample to a particle beam.

Milling a sample with a beam of particles, such as a beam of ions or electrons, is a process known to the person skilled in the art. Milling may be performed by a particle beam alone (e.g. using an ion beam), but may also be performed in the presence of certain etchants. The etching effect of these etchants may be triggered or greatly enhanced by the particle beam.

In still another embodiment of the method according to the invention attaching the sample is performed with EBID or IBID or LBID.

Connecting two work pieces with EBID, IBID or LBID is a process known to the person skilled in the art.

In another embodiment of the method according to the invention during the milling process the supporting film is at least partly removed.

During milling material is often removed from both sides of the sample. This implies that the supporting film is removed at the location where—before attaching the sample to the rigid structure—it supported the sample.

In a further embodiment of the method according to the invention the milling process completely removes the supporting film from at least the thinned part of the sample.

By completely removing the supporting film from at least the thinned part of the sample not only milling of both sides of the sample is possible, but it also avoids contamination of the sample or at least the presence of supporting film material on the thinned part of the sample, which could hinder further analysis of the sample.

In an aspect of the invention a sample carrier for carrying a sample in a particle-optical apparatus, said sample carrier provided with a rigid structure showing an outer boundary to which a sample can be attached, is characterized in that the sample carrier comprises a supporting film for supporting the sample, said supporting film adhered to said rigid structure and extending from the outer boundary, so that the supporting film is not completely surrounded by the rigid structure.

It is remarked that a sample carrier provided with a rigid structure in the form of e.g. a copper gauze and a supporting film of e.g. carbon. Such sample carriers are routinely used in TEM microscopy. In such grids the supporting film is completely surrounded by the outer boundary of the rigid structure, contrary to the sample carrier according to the invention, in which the support film extends beyond the outer boundary of the rigid structure.

In an embodiment of the sample carrier according to the invention the supporting film is a carbon film or a polymer film.

It is a well known technique to produce flat film of carbon or polymer to form supporting films on TEM grids. This same technique can be used for producing the sample carriers according to the invention.

In another embodiment of the sample carrier according to the invention the rigid structure comprises a metal.

The production of sample carriers from a metal, such as copper, stainless steel, iron, molybdenum, aluminium, titanium, silver, platinum, or alloys comprising one or more of these materials, is known to the person skilled in the art.

FIG. 1A schematically depicts a sample carrier according to the invention and a probe with the sample approaching the sample carrier.

FIG. 1A shows a sample 1 attached to probe 2. The sample carrier 3 comprises two parts, the supporting film 4 and the rigid part 5. The rigid structure shows an outer boundary 6. The supporting film partially extends beyond this outer boundary 6 of the rigid structure 5.

The rigid part of the sample carrier may be a copper foil. Also other materials may be used, preferable electrically conductive. Also the supporting film is preferably electrically conductive, e.g. a carbon film or a film of a conductive polymer. However, also the use of supporting films made from silicon or e.g. nitride can be envisaged.

The sample can be attached to the probe by electrostatic forces, e.g. to a glass electrode that is electrically charged. Also other means of attachment may be used, such as based on glue, Beam Induced Deposition (laser, ion or electron), a mechanical gripper or e.g. using vacuum force (suction).

The supporting film is preferably a very thin film with a thickness of e.g. 100 nm or less. The supporting film is therefore transparent to observation methods using e.g. light or Scanning Electron Microscopy, so that the sample is easily aligned to the rigid structure at the other side of the supporting film. However, much thicker films of several hundreds of nanometers have been used successfully. An advantage of such thicker films is that it is easier to produce a flat film in the same plane as the rigid part of the sample carrier.

Figure 1B:
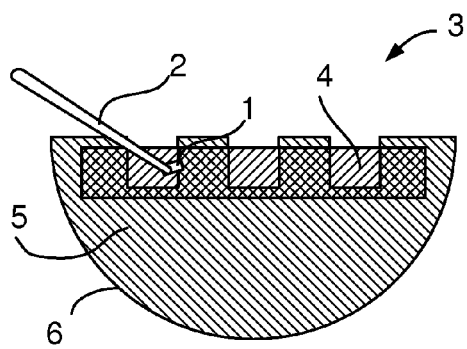

FIG. 1B schematically depicts the sample carrier where the probe positions the sample on the supporting film.

FIG. 1B can be thought to be derived from FIG. 1A. Probe 2 and sample 1 are moved to the sample carrier 3 and positioned such, that the sample may be placed on supporting film 4 and close to or overlapping the rigid structure 5.

The sample is placed on the side of the supporting film opposite to the rigid structure.

Figure 1C:
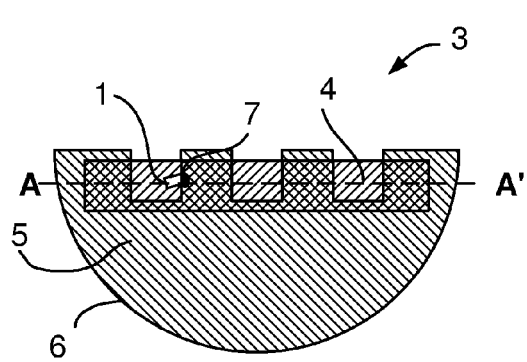

FIG. 1C schematically depicts the sample carrier and the sample attached to it.

FIG. 1C can be thought to be derived from FIG. 1B. Probe 2 is now removed, and sample 1 is attached to the rigid structure 5 with a weld 7. This weld can be a weld made with EBID, IBID or LBID, or it can e.g. be a weld made by the deposition of a droplet of glue.

It is remarked that this weld needs to be present at the moment the thinning starts, but that it is not necessary to do so at the moment that the probe it removed. Experiments show that the sample sticks to the sample carrier sufficiently to keep its position on the sample carrier, and that it can even be transported unwelded to another (dedicated) apparatus where the thinning takes place.

It is further remarked that the weld will often be formed to the rigid structure, as the supporting film is too fragile to withstand e.g. Beam Induced Deposition (EBID, IBID or LBID).

Figure 1D:
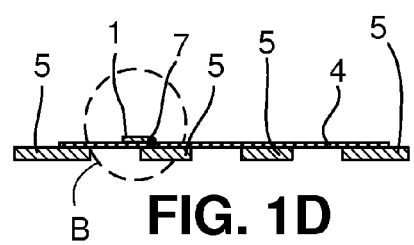

FIG. 1D schematically depicts a cross section of the sample carrier and the sample attached to it.

FIG. 1D shows a cross-sectional view of the sample carrier depicted in FIG. 1C along line AA' can be thought to be derived from FIG. 1C. The supporting film 4 is shown to adhere to the rigid structure 5. As can be seen, sample 1 is supported by the supporting film 4 and attached to the outer edge 6 of rigid structure 5.

Figure 1E:
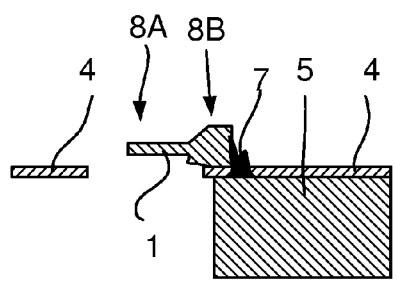

FIG. 1E schematically depicts a detail from FIG. 1D after thinning of the sample.

FIG. 1E schematically shows area B from FIG. 1D after thinning the sample. Supporting film 4 is not a continuous film anymore, but a cut-out is made in it during the thinning of the sample (as will be shown in FIG. 1F). Rigid structure 5 and sample 1 are connected by weld 7.

In the thinning process sample 1 is at side 8A thinned, while at side 8B it retained its original thickness so as not to damage the weld, what could lead to loss of the sample. The sample is thus not completely thinned to a uniform thickness, which would be difficult in the direct proximity of the weld and rigid structure. However, the part of interest of the sample is thinned to a uniform thickness and no material from the supporting film is left on the thinned part of the sample.

In this figure it is also shown that the sample and the sample carrier are not in direct contact with each other, but that a small gap exists between them: gap 9. Such a gap may be present as long as weld 7 can bridge the gap, but such a gap need not be present.

Figure 1F:
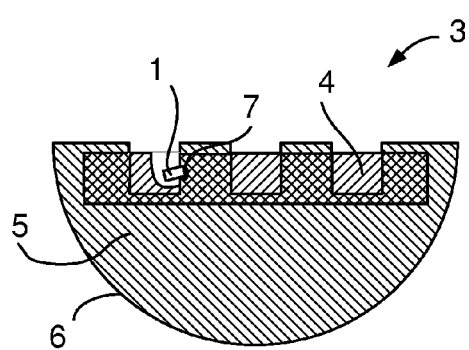

FIG. 1F schematically depicts the sample carrier and the thinned sample attached to it.

FIG. 1F can be thought to be derived from FIG. 1C. As was already shown in FIG. 1E the sample is thinned, which caused a cut-out 10 to be formed in the supporting film 4. The sample is now thinned and ready for inspection/analysis in e.g a TEM or a Scanning Transmission Electron Microscope (STEM), or another instrument in which the sample needs to show a defined surface or thickness.

It is remarked that it is envisaged that a sample is first placed on the supporting film, then attached to the rigid structure, after which the supporting film is removed, by e.g. milling, etching or dissolving the supporting film.

Figure 2:
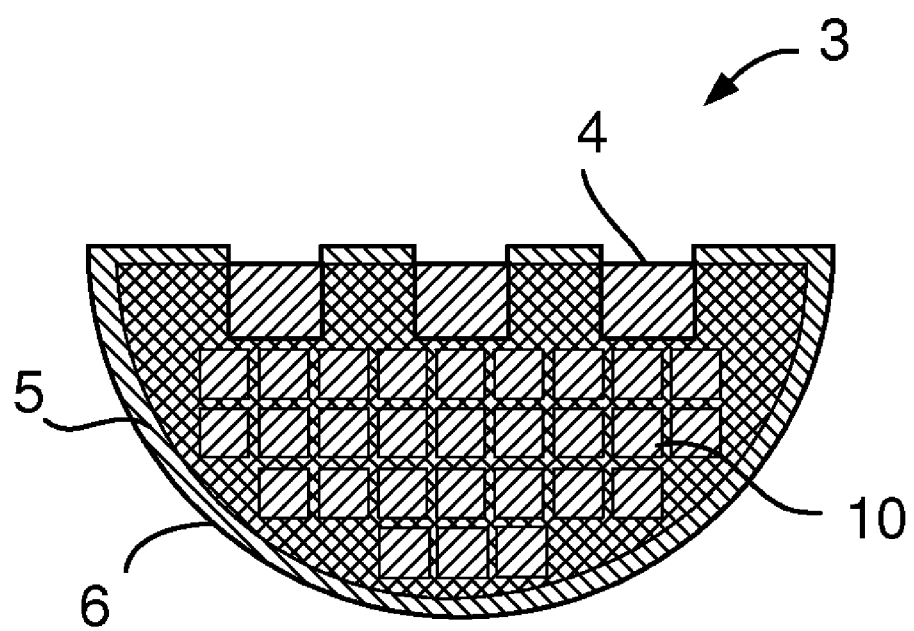

FIG. 2 schematically depicts an alternative sample carrier according to the invention.

FIG. 2 can be thought to be derived from FIG. 1A. The sample carrier 3 depicted here not only comprises an outer boundary 6 to which samples can be attached, but also an area with a gauze or mesh, that is: an area with a multitude of cut-outs 10. The supporting film 4 extends over the area of the gauze, thereby creating multiple locations where a sample can be placed on the supporting film.

By forming the supporting film sufficiently thin to be transparent to e.g. an electron beam of a TEM, the sample carrier can also be used as a conventional TEM grid. As known to the person skilled in the art, such supporting films are known from conventional TEM grids.

It is remarked that it is also envisaged that the supporting film does not cover or does not completely cover the gauze, and that the sample is completely supported to or solely attached to the rigid structure.

It is further envisaged that a sample is first placed on the supporting film, then attached to the rigid structure, after which the supporting grid is removed, by e.g. milling, etching or dissolving the supporting film. This enables the use of a supporting film that in itself is not sufficiently thin to be penetrated by an electron beam, or at least so thick that they would hinder proper analysis of the sample.

It is remarked that inspection/analysis of the sample can take place in another apparatus than in the apparatus in which

We claim as follows:

1. A method for thinning a sample, the method comprising:
providing a sample attached to a probe,
providing a sample carrier, said sample carrier having a rigid structure, said rigid structure having a boundary to which the sample can be attached,
attaching the sample to the boundary of the rigid structure, and
exposing the sample to a milling process or an etching process so as to at least partially thin the sample,
removing a portion of the film beneath the portion of the sample that extends beyond the rigid structure using a charged particle beam,
characterized in that
the sample carrier is provided with a supporting film adhered to said rigid structure, said supporting film at least partially extending beyond the boundary of the rigid structure to which the sample can be attached, and
before attaching the sample to the rigid structure the sample is placed completely on the supporting film.

2. The method of claim 1 in which the sample is placed on the surface of the film opposite to the rigid structure.

3. The method of claim 2 in which, after placing the sample on the supporting film, a part of the supporting film is situated between a part of the sample and the rigid structure.

4. The method of claim 1 in which the boundary is an outer boundary, so that the supporting film is not completely surrounded by the rigid structure.

5. The method of claim 1 in which exposing the sample to a milling process or an etching process comprises exposing the sample to a particle beam.

6. The method of claim 1 in which attaching the sample is performed with EBID or IBID or LBID.

7. The method of claim 1 in which during the milling process or etching process the supporting film is at least partly removed.

8. The method of claim 7 in which the milling process or etching process completely removes the supporting film from at least the thinned part of the sample.

9. The method of claim 1 in which the supporting film is a carbon film or a polymer film.

10. The method of claim 1 in which the rigid structure comprises a metal.

11. A method for thinning a TEM sample, the method comprising:
providing a TEM sample attached to a probe,
providing a sample carrier for holding the TEM sample, the carrier comprising: a rigid structure having an upper surface and an outer boundary, and a supporting film for supporting the TEM sample, a portion of said supporting film adhered to the upper surface of the rigid structure, and a portion of said supporting film extending beyond the outer boundary of the rigid structure,
placing the TEM sample completely on the supporting film so that at least a portion of the TEM sample is located on the portion of the supporting film with no underlying rigid structure,
removing a portion of the film beneath the portion of the sample that extends beyond the rigid structure using a charged particle beam,
attaching the sample to the carrier, and
exposing the sample to a milling process or an etching process so as to at least partially thin the portion of the sample extending beyond the outer boundary of the rigid structure.

12. The method of claim 11 in which placing the TEM sample on the supporting film so that at least a portion of the TEM sample is located on the portion of the supporting film with no underlying rigid structure comprises placing the sample on the supporting film opposite the rigid structure so that a portion of the sample overlaps the underlying rigid structure; and
in which attaching the sample to the carrier comprises attaching the sample to the carrier by EBID or IBID, such that the supporting film is removed while performing the EBID or IBID and the sample is attached directly to the rigid structure.

13. The method of claim 1 in which before attaching the sample to the rigid structure the sample is placed on the supporting film so that the sample is not touching the rigid structure and a weld that attaches the sample to the rigid structure bridges a gap to connect the sample and the rigid structure.

14. The method of claim 1 in which placing the TEM sample on the supporting film so that at least a portion of the TEM sample is located on the portion of the supporting film with no underlying rigid structure include placing the TEM sample on the supporting film so that the sample is not touching the rigid structure and a weld that attaches the sample to the rigid structure bridges a gap to connect the sample and the rigid structure.

15. The method of claim 1 in which the sample is placed on the surface of the film that is not adhered to the rigid structure.

16. The method of claim 1 in which the sample and the supporting film form a first area of contact, and the supporting film and the rigid structure form a second area of contact, and wherein a portion of the supporting film is situated between the first area of contact and the second area of contact.

* * * * *